(12) United States Patent
Arad et al.

(10) Patent No.: US 11,251,245 B1
(45) Date of Patent: Feb. 15, 2022

(54) RESPONDING TO A FAILURE OF A MAIN DIE OF A SWITCH DATA-PLANE DEVICE

(71) Applicant: XSIGHT LABS LTD., Kiryat Gat (IL)

(72) Inventors: Carmi Arad, Nofit (IL); Guy Koren, Rishon Lezion (IL); Gal Malach, Gedera (IL); Erez Shaizaf, Nir Chen (IL)

(73) Assignee: XSIGHT LABS LTD., Kiryat Gat (IL)

( * ) Notice: Subject to any disclaimer, the term of this patent is extended or adjusted under 35 U.S.C. 154(b) by 0 days.

(21) Appl. No.: 16/747,574

(22) Filed: Jan. 21, 2020

Related U.S. Application Data

(60) Provisional application No. 62/794,709, filed on Jan. 21, 2019.

(51) Int. Cl.
| | |
|---|---|
| *H04L 12/66* | (2006.01) |
| *H01L 27/32* | (2006.01) |
| *H04L 45/00* | (2022.01) |
| *H04L 45/16* | (2022.01) |
| *H01L 23/00* | (2006.01) |
| *H04L 12/18* | (2006.01) |
| *H01L 23/528* | (2006.01) |
| *H04L 47/2425* | (2022.01) |

(52) U.S. Cl.
CPC ........ *H01L 27/3255* (2013.01); *H01L 23/528* (2013.01); *H01L 24/01* (2013.01); *H04L 12/18* (2013.01); *H04L 45/16* (2013.01); *H04L 45/54* (2013.01); *H04L 47/2433* (2013.01)

(58) Field of Classification Search
CPC .... H04L 27/3255; H04L 23/528; H04L 24/01
See application file for complete search history.

(56) References Cited

U.S. PATENT DOCUMENTS

| | | | |
|---|---|---|---|
| 6,614,796 B1 * | 9/2003 | Black .................. | H04L 12/4625 370/230 |
| 9,971,733 B1 * | 5/2018 | Teh ........................... | G06F 1/10 |
| 2013/0215769 A1 * | 8/2013 | Beheshti-Zavareh ....... | H04W 16/18 370/252 |
| 2015/0341253 A1 * | 11/2015 | Scheurich ........... | H04L 41/0806 370/422 |
| 2015/0358200 A1 * | 12/2015 | Mahajan ................. | H04L 41/12 370/225 |
| 2016/0241430 A1 * | 8/2016 | Yadav ................. | H04L 43/0811 |
| 2017/0126588 A1 * | 5/2017 | Anand .................... | H04L 49/70 |
| 2020/0051961 A1 * | 2/2020 | Rickard .............. | H01L 23/5385 |
| 2020/0105718 A1 * | 4/2020 | Collins ................... | H01L 25/18 |

* cited by examiner

*Primary Examiner* — Abdelnabi O Musa
(74) *Attorney, Agent, or Firm* — Reches Patents

(57) ABSTRACT

A method for responding to a failure of a main die of a switch data-plane device, the method may include applying a secondary packet forwarding process by multiple chiplets, following the failure of the main die and during at least a part of an execution of a synchronous graceful process that follows the failure of the main die; wherein the multiple chiplets are interconnected to each other by a secondary interconnect; wherein the multiple chiplets and are coupled to the main die by a primary interconnect; wherein the applying of the secondary packet forwarding process is less complex than a primary forwarding process applied by the main die while the main die is functional.

29 Claims, 8 Drawing Sheets

RESPONDING TO A FAILURE OF A MAIN DIE OF A SWITCH DATA-PLANE DEVICE

CROSS REFERENCE

This application claims priority from U.S. provisional patent 62/794,709 filing date Jan. 21, 2019

BACKGROUND

A datacenter is a pool of resources including compute, storage and variety accelerators which are connected together using a dedicated network.

Datacenter applications show growing demand in increasing the communication throughput and decreasing the latency. Both requirements are being answered by designing high throughput switches. In the 2019 market a high throughput may be of an order of terabit per second throughput.

A high throughput switch provides not only high throughput but also low latency because it allows building networks with small hop count among the communicating end-points. High throughput switches present a reliability challenge, also known as "blast radius"—a failure of a single high capacity switch may cause outage of significant number of services or users for the time it takes to replace the switch and re-heal the network.

The traditional approach to improve reliability is by redundancy. For example, a backup switch exponentially reduces the Mean Time Between Failures (MTBF). However, the huge size of modern datacenter networks makes switch level redundancy a prohibitively expensive solution and sets the stage for cheaper approaches.

There is a growing need to provide a cost effective solution to data center failures.

SUMMARY

There may be provided devices, methods and computer readable media as illustrated in the specification and/or the claims and/or the drawings.

There may be provided a switch data-plane device that may include a main die, a primary interconnect, multiple chiplets, and a secondary interconnect. The multiple chiplets may be interconnected to each other by the secondary interconnect. The multiple chiplets and may be coupled to the main die by the primary interconnect. The main die may be configured to apply a primary forwarding process while the main die may be functional. The multiple chiplets may be configured to apply a secondary packet forwarding process by multiple chiplets, following the failure of the main die and during at least a part of an execution of a synchronous graceful process that follows the failure of the main die. The applying of the secondary packet forwarding process may be less complex than the applying of the primary packet forwarding process by the main die.

There may be provided a method. The method may start by receiving an indication that the main die failed or determining that the main die failed. The failure of the main die may be such that triggers an initiation of a synchronous graceful failure. The main die and multiple chiplets belong to a high capacity switch data-plane device. The determining that the main die failed may be executed by a switch management processor of the high capacity switch data-plane device or by another entity within the high capacity switch data-plane device or outside the high capacity switch data-plane device. The method may include applying a secondary packet forwarding process by multiple chiplets, following the failure of the main die and during at least a part of the execution of the synchronous graceful process. The applying of the secondary packet forwarding process may be less complex than a primary forwarding process applied by the main die while the main die may be functional.

There may be provided a non-transitory computer readable medium that may store instructions for: applying a secondary packet forwarding process by multiple chiplets, following a failure of a main die and during at least a part of an execution of a synchronous graceful process that follows the failure of the main die; wherein the main die belongs to a switch data-plane device; wherein the multiple chiplets may be interconnected to each other by a secondary interconnect; wherein the multiple chiplets and may be coupled to the main die by a primary interconnect; wherein the applying of the secondary packet forwarding process may be less complex than a primary forwarding process applied by the main die while the main die may be functional.

The multiple chiplets may be interconnected to each other by a secondary interconnect. The multiple chiplets may be coupled to the main die by a primary interconnect. The second interconnect may couple the multiple chiplets to form a bidirectional ring of chiplets.

The applying of the secondary packet forwarding process may include at least one out of: (a) Utilizing, by each chiplet, a secondary chiplet forwarding database that has a size that may be a fraction of a primary forwarding database utilized by the main die when performing the primary forwarding process. (b) Unicasting packets that may be labeled as unicast packets in one or more secondary chiplet forwarding database of one or more chiplets; and selectively broadcasting other packets. (c) Applying source filtering. (d) Applying split horizon filtering. (e) Assigning a lower priority to selectively broadcast packets and assigning a higher priority to unicast packets. (f) Allocating a first bandwidth to packets that may be exchanged with the network. (g) Allocating a second bandwidth to packets that may be conveyed between the multiple chiplets. (h) Preventing, during the selective broadcasting, from broadcast packets to reach the management processor. (i) Preventing, during the selective broadcasting, from broadcast packets to reach predefined ports of the chiplets.

BRIEF DESCRIPTION OF THE DRAWINGS

In order to understand the invention and to see how it may be carried out in practice, a preferred embodiment will now be described, by way of non-limiting example only, with reference to the accompanying drawings.

DETAILED DESCRIPTION OF THE DRAWINGS

Figure 1:
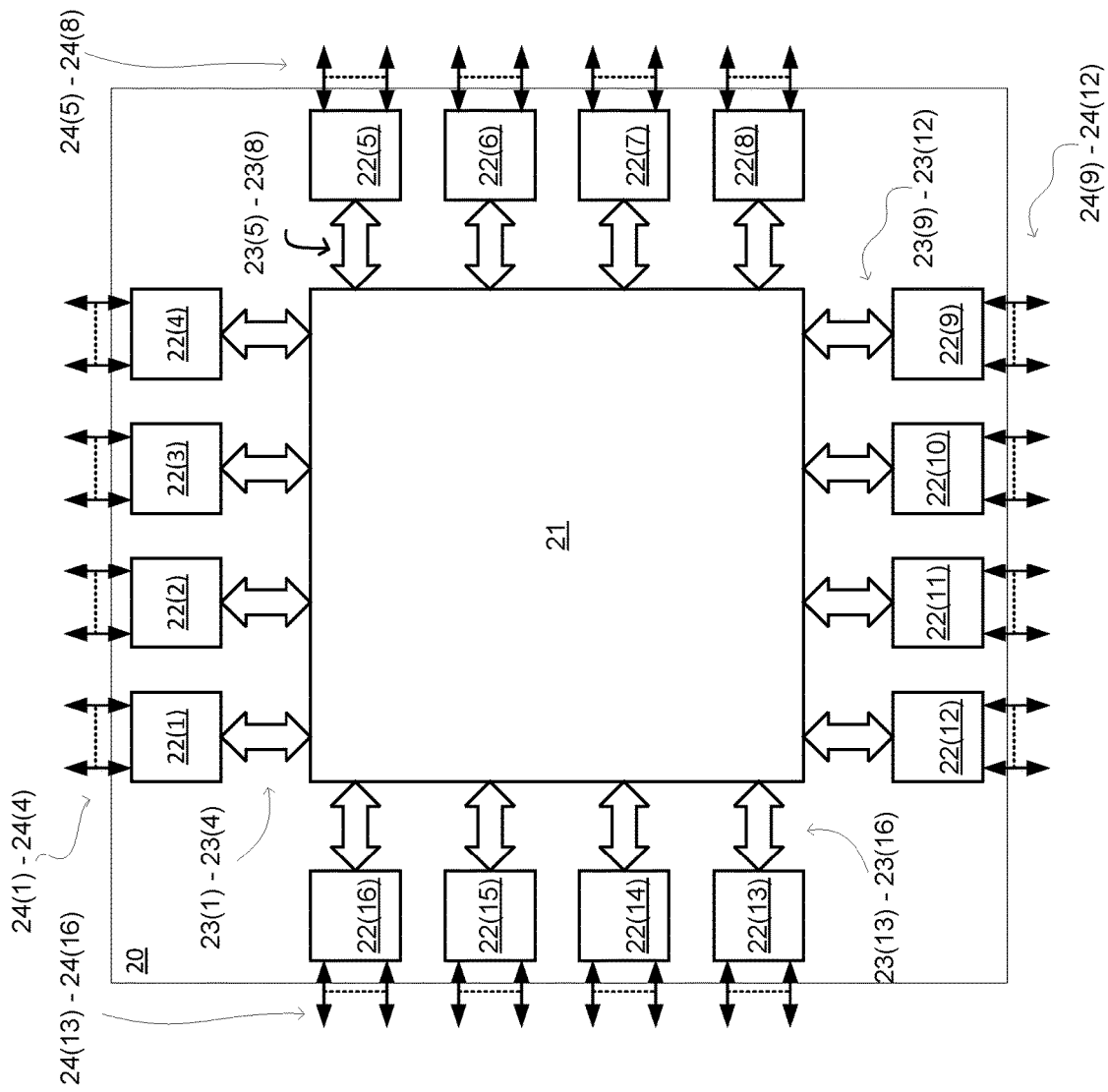
FIG. 1 illustrates an example of a switch data-plane device.

Any reference to a system should be applied, mutatis mutandis to a method that is executed by a system and/or to a non-transitory computer readable medium that stores instructions that once executed by the system will cause the system to execute the method.

Any reference to method should be applied, mutatis mutandis to a system that is configured to execute the method and/or to a non-transitory computer readable medium that stores instructions that once executed by the system will cause the system to execute the method.

Any reference to a non-transitory computer readable medium should be applied, mutatis mutandis to a method that is executed by a system and/or a system that is configured to execute the instructions stored in the non-transitory computer readable medium.

Any reference to a "solution" should be applied mutatis mutandis, to a method, system, and a non-transitory computer readable medium as illustrated below.

The term "and/or" is additionally or alternatively.

The term "configured to" may mean "constructed and arranged" and/or "programmed to".

In the following description and related drawings there may be provided various numerical examples (for example sixteen chiplets)—but any other numbers may be provided.

The switch data-plane is the component responsible for packet by packet forwarding and filtering among switch ports.

There may be provided a Graceful Failure based solution that introduces "just enough" redundancy into the switch, so even in case of failure, a low bandwidth connectivity is still maintained with the partitioned part of the network. This communication channel would be used for performing ordered ("synchronous") shutdown of the partitioned part. For example, it can perform Virtual Machine (VM) migration or maintain consistency in a distributed database. Synchronous shutdown is used each time a data center component requires maintenance (e.g. replacement, upgrade or firmware update). The synchronous shutdown seldom results in service outage. On the other hand, recovery from asynchronous failures (e.g. network partition that happens unexpectedly), are more difficult to verify and therefore are may result in service disruption and even complete outage.

The suggested Graceful Failure converts asynchronous failure events into manageable synchronous "maintenance shutdown" events. It can be used where switch level redundancy is too expensive to be applied.

The switch deployment preferences in datacenters face two conflicting requirements: service provisioning calls for high capacity reliable switches, while economics calls for using fixed configuration switches deployed with no switch level redundancy at the ToR level.

This conflict can be bridged using Graceful Failure—using fixed configuration switches with just enough redundancy to convert asynchronous failures to synchronous, maintenance-like, shutdown procedure.

High capacity data-plane devices are partitioned into several dies. The dies are packaged in one package hiding the disaggregated properties of the design from the external world.

FIG. 1 is an example of a partition of a high capacity switch data-plane device 20 to multiple dies. In this partition the main die 21 is responsible for packet buffering, queueing, forwarding/filtering decisions and header editing. The peripheral devices (referred to as chiplets) 22(1)-22(16) implement the Ethernet ports. The peripheral devices may perform PHY layer operations.

The chiplets 21(1)-22(16) are coupled to the main die 21 via a primary interconnect that may include high speed connections 23(1)-23(16) and are coupled to network nodes outside the high capacity switch data-plane device 20 via group of ports 24(1)-24(16). Each chiplet has one or more network ports. The network nodes outside the high capacity switch data-plane device 20 may be servers, switches and the like.

In this partition, all traffic is conveyed through the main die 21 because: (1) only the main die is capable of taking forwarding decisions, and (2) the main die is the single interconnect among the chiplets.

Assuming that we consider single die failures then the main die 21 would be the single point of failure for the entire data plane.

A failure of a chiplet of 22(1)-22(16), may result in limited outage because the main die 21 and the remaining chiplets are still functional. Graceful Failure should therefore provide alternatives to the functions of the main die 21. Thus—a failure of the first die may trigger a synchronous graceful failure. This failure can be a complete shutdown of the main die or any failure that may substantially limit the capability of the main die to successfully apply a primary packet forwarding process for forwarding packets.

The main die is a part of a switch data-plane device. What results to a failure that triggers the synchronous graceful failure may be determined by one or more network manager located outside the device and/or by the device itself.

A possible extension of the above partition to support synchronous graceful failure would extend the chiplet functionality with (1) taking limited forwarding decisions, and (2) alternative low speed interconnect among the chiplets.

One simple solution would use double ring interconnecting the chiplets. A ring interconnect is both low cost and uses very simple forwarding policy. Other interconnects may be used.

Figure 2:
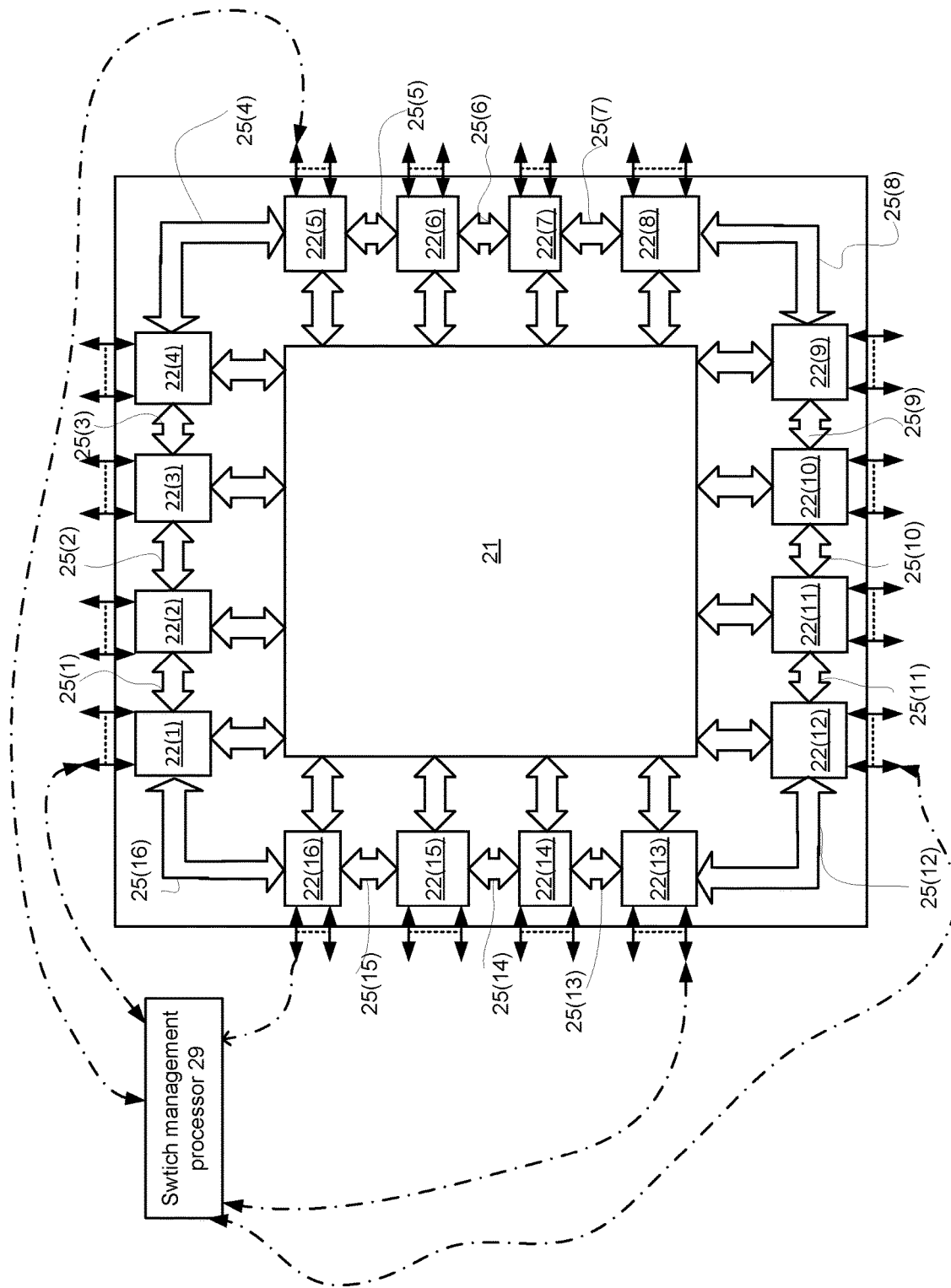
FIG. 2 illustrates an example of a switch data-plane device.

FIG. 2 illustrates the high capacity switch data-plane device 20 as including a secondary interconnect that may include high speed interconnects 25(1)-25(16) that serially connect the chiplets 22(1)-22(16) to form a ring of chiplets. The chiplets are also coupled to the main die 21 via high speed connections 23(1)-23(16) and are coupled to components outside the high capacity switch data-plane device 20 via group of ports 24(1)-24(16).

FIG. 2 also illustrates a switch management processor 29 that may be configured to manage the chiplets and detect a failure of the main chip 21. Some of the ports of the group of ports 24(1)-24(16) are referred to as management ports and are connected to the switch management processor. For example—each group of ports may include a management port, yet for example—only some group of ports include a management port, one or more group of ports may include more than a single management port, and the like.

Every chiplet holds a forwarding databases, designed to provide connectivity to all sessions but in particular to guarantee connectivity to the management sessions. To keep the forwarding databases as small as possible, the ring supports two forwarding modes:

a. Packets whose header is registered in the chiplets forwarding databases are forwarded as Unicast. In order to guarantee connectivity to the management sessions, these must be registered in the Unicast forwarding databases.

b. Unregistered packets are Broadcasted to all network ports. It will be shown that Broadcast packets may use only the remaining link bandwidth, not used by Unicast packets.

Broadcast support:
a. Selective broadcast—define the ports members in the broadcast domain. For example, management ports should be excluded from the broadcast domain
b. Source filter—packets are not forwarded to their source port/trunk.
c. Split horizon—packets received on Spine switch facing ports are not forwarded to other Spine switches and are forwarded to all server facing ports. Packets received on server facing ports are forwarded to all Spine switches and all server facing ports.

To further protect the network from loops caused by broadcasting, the chiplets support time to live (TTL) that guarantees that the packets will not loop between the chiplets for a period above the initial TTL value.

Unicast traffic is be forwarded in strict high priority over Broadcast traffic, making Broadcast traffic to be forwarded in best effort.

Figure 3:
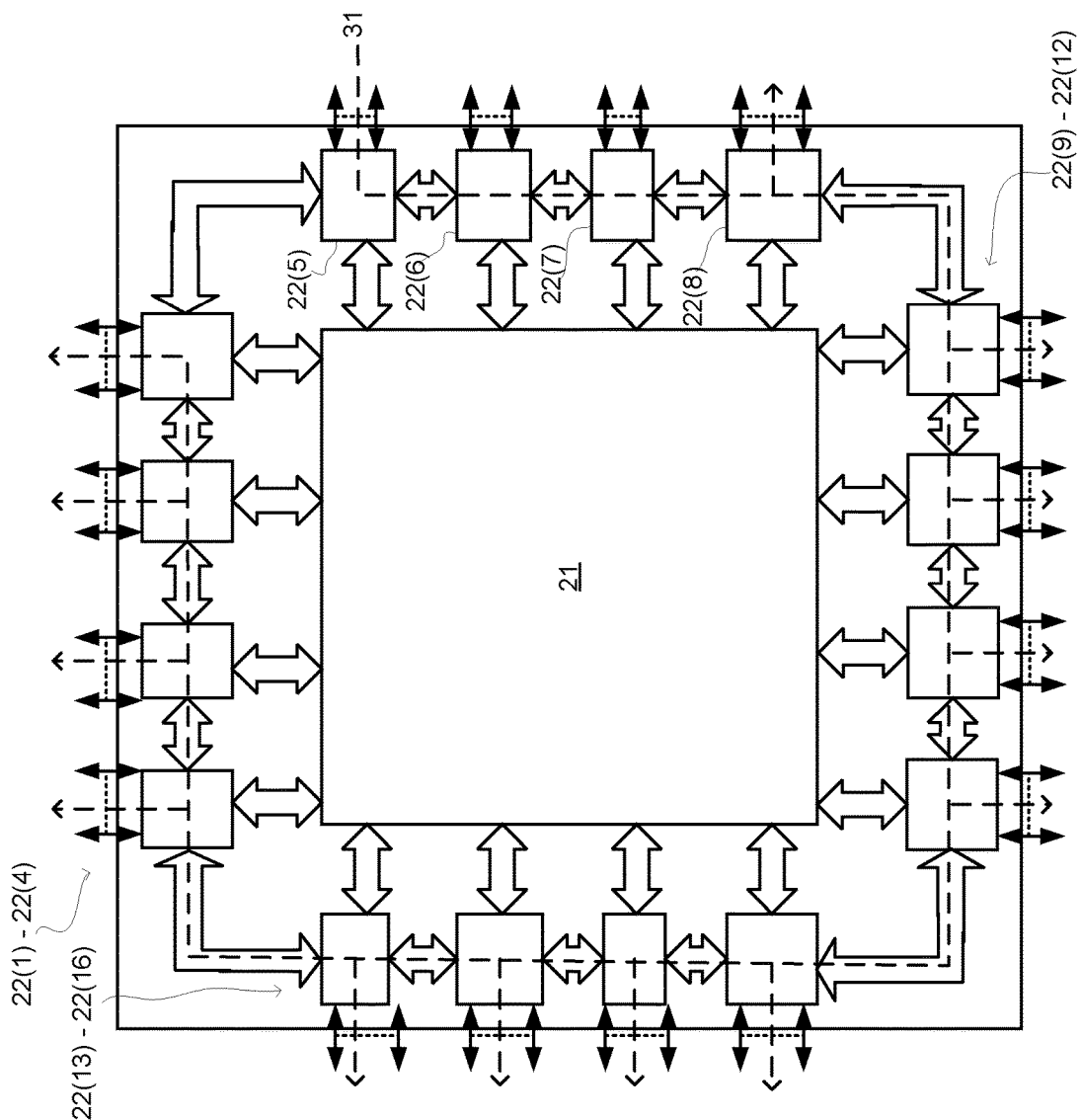
FIG. 3 illustrates an example of a switch data-plane device.

FIG. 3 illustrates a packet 31 that is received by fifth chiplet 22(5). The packet header is not registered in the chiplet forwarding database and thus is broadcasted to all chiplets 22(6)-22(16) and 22(1)-22(4).

Chiplet 22(6) does not output the packet due to source filtering. Source filter is a port characteristic, so the packet might be forwarded to some of Chiplet 22(6) ports and filtered on other ports.

Chiplet 22(7) does not output the packet due to slit horizon filtering. Split Horizon filter is a port characteristic, so the packet might be forwarded to some of Chiplet 22(7) ports and filtered on other ports.

Other chiplets (22(8)-22(16) and 22(1)-22(4)) do not filter the packet and output it.

Figure 4:
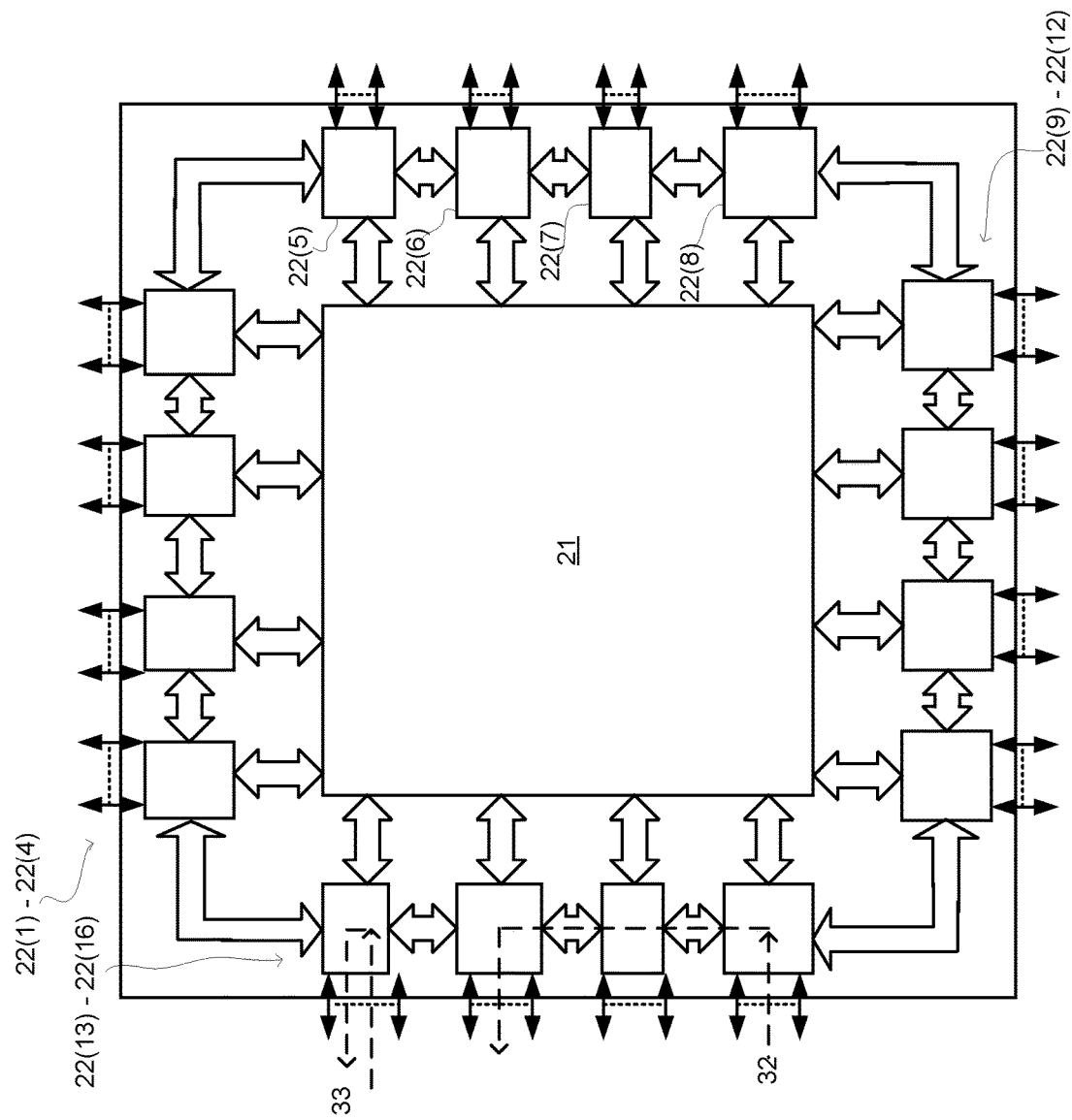
FIG. 4 illustrates an example of a switch data-plane device.

FIG. 4 illustrates packet 33 that is received by chiplet 22(16) and its header is registered in the chiplet forwarding database as being destined to an entity that is also coupled to chiplet 22(16)—thus chiplet 22(16) unicasts this packet.

FIG. 4 also illustrates packet 32 that is received by chiplet 22(13) and its metadata appears in the chiplet forwarding database as being destined to an entity that is coupled to chiplet 22(15)—thus packet 33 is inter-unicasted through chiplet 22(14) to chiplet 22(15) and is then outputted by chiplet 22(15).

A switch management processor (denoted 29 in FIG. 2) may be configured to manage the chiplets and communicate with other network entities such as a software defined networking (SDN) controller (or a like) and other switches. The SDN controller may be implemented, for example, by one of the servers coupled to the device (see, for example, one or more servers denoted SR11 11', SR15 15' SR81 81' or SR85 85' of FIG. 8 may participate in network management, may implement the SDN controller and/or may execute a synchronous graceful failure following the failure of the main chip). Chiplet management is performed using a low cost management interface, not through the main die. Examples of such interfaces are SPI and I2C. Communication with other networking entities uses the same management port(s) used for the same task before the main die failure.

To enable traffic through the ring of chiplets, the management processor should configure the chiplets forwarding databases. Since the network topology is dynamic and may change during normal operation as well as during the synchronous shutdown procedure, the management processor must dynamically update the forwarding databases on each topology change.

The chiplet forwarding databases may, for example, hold only SDN controller sessions and basic communication with peer switches (e.g. ARP messages). These sessions are (1) few, and (2) agnostic to the type or scale of the services provided by that datacenter. These properties may make the forwarding database small and easily configurable because they are a-priori known to the SDN controller.

When the management processor detects failure of the main-die (e.g. timeout on the configuration interface to the main die), it (1) updates the SDN controller to commence the shutdown procedure, and (2) turns-on the redundant interconnect by signaling every chiplet. During the shutdown procedure, the management processor's "outbound" tasks do not significantly change—it still communicates with the SDN controller and peripheral switches. However, internally it manages a different data-plane (the ring interconnect).

While the synchronous shutdown procedure is in progress, the management processor sends traffic to the network by appending each packet with a Forwarding Label. It receives traffic from the network, by configuring specific sessions in the chiplet forwarding databases. Some examples:
a. IP2ME is redirected to the management ports
b. ARP is redirected to the management ports based on EtherType Configuring the control protocols in the forwarding databases is required because the management ports are protected from broadcast storms by excluding them from the "unregistered" traffic broadcast domain.

Non-limiting examples of functionality not supported (or supported in a limited manner) solely by the chiplets—thereby simplifying the decisions made by the chiplets—and reducing the chiplet forwarding tables may include at least some of the following functions:
a. Unicast forwarding is limited to IPv4/6 host addresses. Prefixes are not supported. Connectivity of other protocols is supported by Broadcasting
b. Limited packet header editing
  i. MAC SA/DA modification so next hop routers are capable of routing the packet
  ii. IP<TTL> decrement to protect against endless loops
  iii. Ring forwarding labels are added on reception and removed before transmission to the network
c. No IP header integrity check, e.g IP checksum check
d. No PFC or any kind of lossless operation
e. No ACLS
f. No telemetry, mirroring, sFlow, NetFlow/IPFIX
g. S&F forwarding, no cut-through forwarding
h. No 1588

Figure 5:
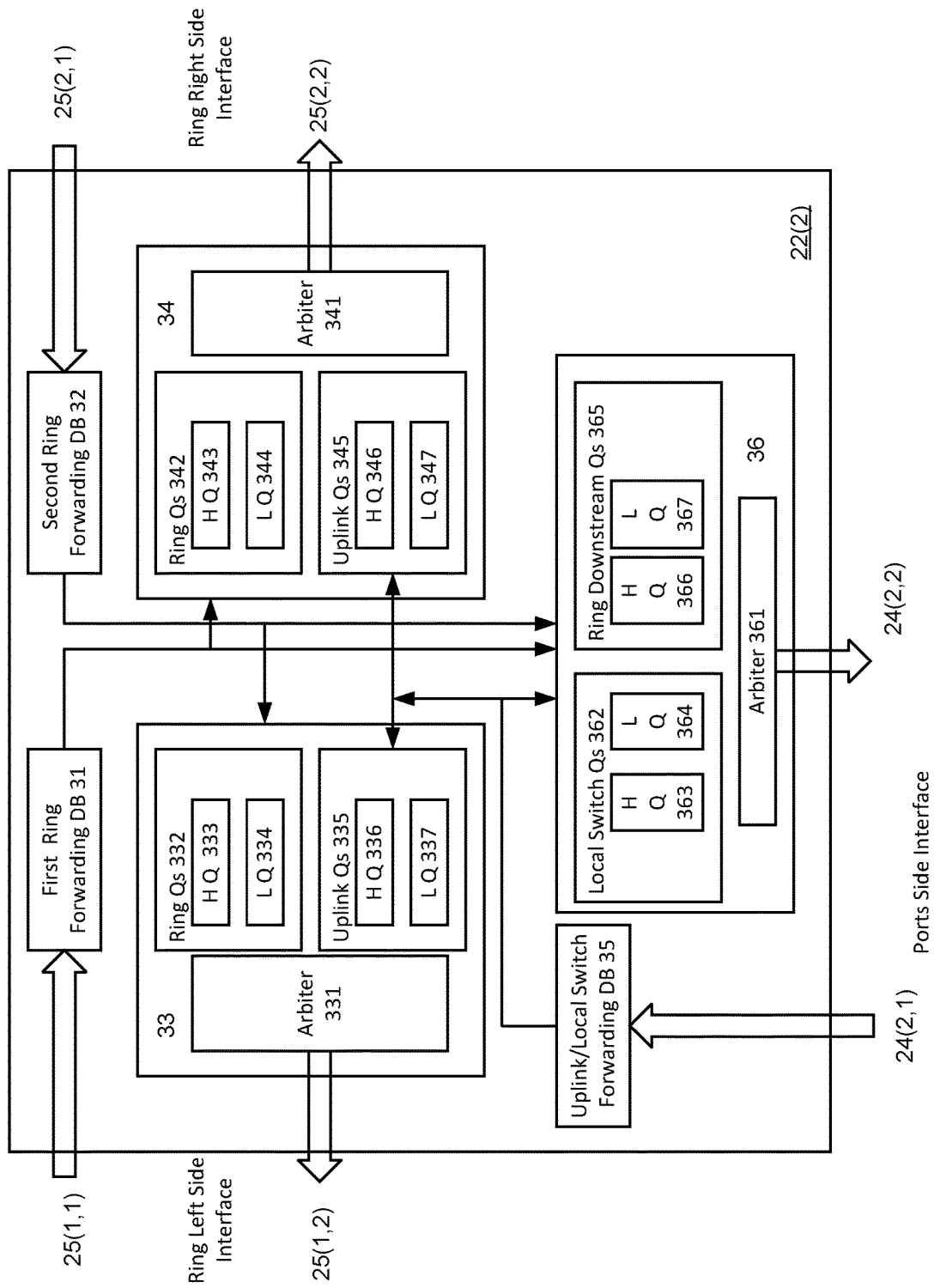
FIG. 5 illustrates an example of a chiplet of a switch data-plane device.

FIG. 5 illustrates an example of the forwarding mechanism embedded in the chiplet 22(2)—the ring switching tap.

In FIG. 5 the chiplet is illustrated as having a group of ports that includes input ports 24(2,1) and output ports 24(2,2), coupled (at the left) to first high speed interconnect 25(1) that includes first input high speed interconnect 25(1, 1) and first output high speed interconnect 25(1,2) and coupled (at the right) to second high speed interconnect that includes an second input high speed interconnect 25(2,1) and second output high speed interconnect 25(2,2).

The chiplet includes:
a. Forwarding databases such as first (CLOCKWISE) ring forwarding DB 31, second (COUNTERCLOCKWISE) ring forwarding database 32 and uplink/local switch forwarding DB 35.
b. First queuing and arbitering unit 33 that includes (a) first ring queues 332 (that include first ring high priority queues 333 and first ring low priority queues 334), (b) first uplink queues 335 (that includes first uplink high priority queues 336 and first uplink low priority queues 337), and (c) first arbiter 331.
  c. Second queuing and arbitering unit 34 that includes (a) second ring queues 342 (that include second ring high priority queues 343 and second ring low priority queues 344), (b) second uplink queues 345 (that includes second uplink high priority queues 346 and second uplink low priority queues 347), and (c) second arbiter 341.
  d. Third queuing and arbitering unit 36 that includes (a) local switch queues 362 (that include local switch high priority queues 363 and local switch low priority queues 364), (b) ring downstream queues 365 (that includes ring downstream queues high priority queues 366 and ring downstream queues low priority queues 367), and (c) third arbiter 361.

Packets from input ports 24(2,1) are processed by accessing uplink/local switch forwarding DB 35. The outcome of the process determines whether the packets are sent to the queues of the second queuing and arbitering unit 34 or the queues of the first queuing and arbitering unit 33.

The outcome of the process may also include the forwarding label. The forwarding label will be removed by the destination chiplet before transmission to the network.

Packets from first input high speed interconnect 25(1,1) are processed by accessing first ring forwarding DB 31. The outcome of the process determines whether the packets are sent to the queues of the second queuing and arbitering unit 34 or the queues of the third queuing and arbitering unit 36. The forwarding in the ring may use forwarding labels and, for example, only packet received on an input network port are subject to header parsing.

Packets from second input high speed interconnect 25(2,1) are processed by accessing second ring forwarding DB 32. The outcome of the process determines whether the packets are sent to the queues of the first queuing and arbitering unit 33 or the queues of the third queuing and arbitering unit 36.

First arbiter 331 arbitrates between packets stored in first ring queues 332 and first uplink queues 335 and output selected packets over first output high speed interconnect 25(1,2).

Second arbiter 341 arbitrates between packets stored in second ring queues 342 and second uplink queues 345 and output selected packets over second output high speed interconnect 25(2,2).

Third arbiter 341 arbitrates between packets stored in local switch queues 362 and ring downstream queues 365 and output selected packets output ports 24(2,2).

Figure 6:
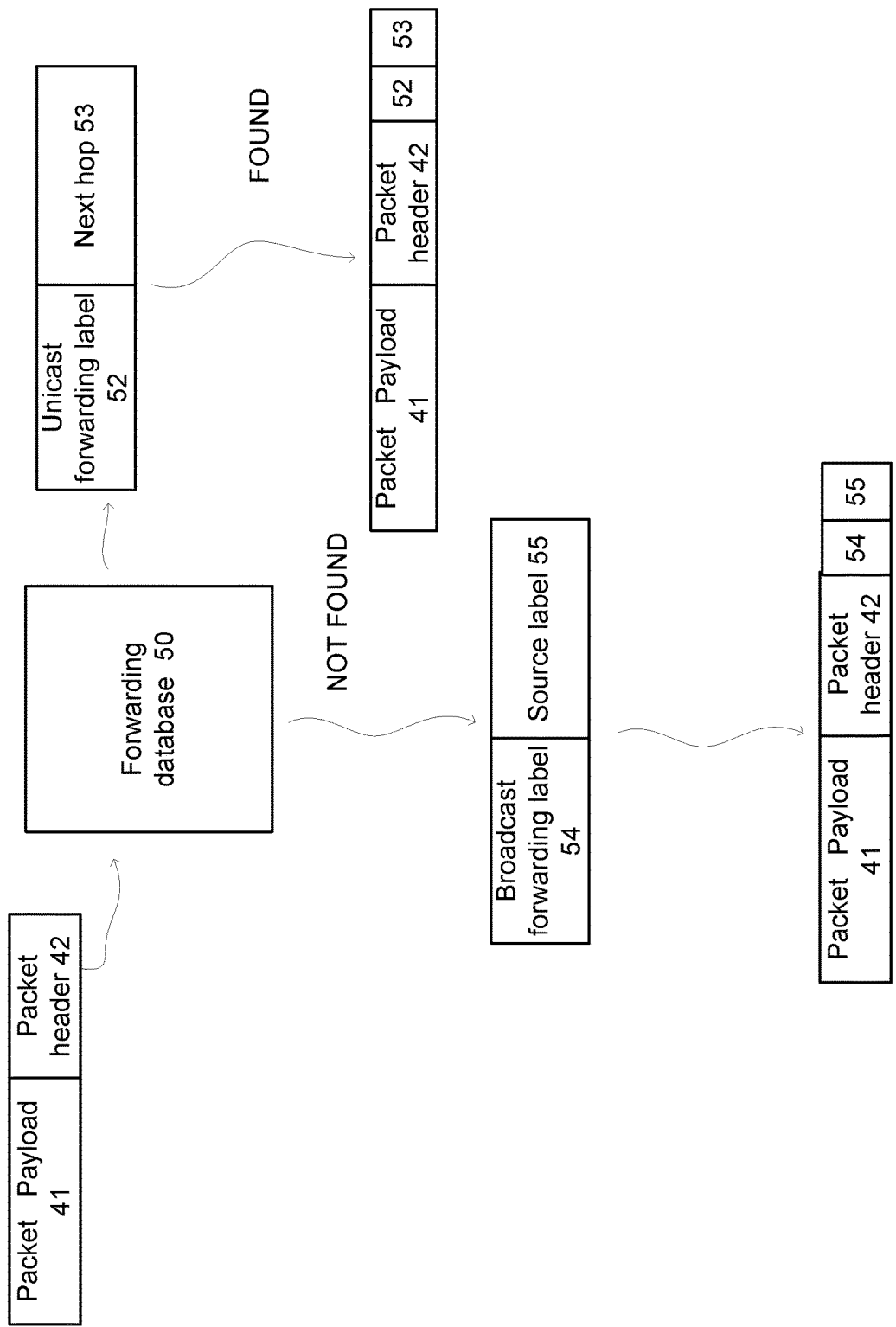
FIG. 6 illustrates examples of various packets and fields.

Once turned-on the chiplet ring switching tap performs the following operations (some of which are illustrated in FIG. 6):
  a. Packets (having packet payload 41 and packet header 42) received on a network (Ethernet) port (such as 24(2,1) of FIG. 5)
    i. Parse the packet header and use it as a key to search the forwarding database 50.
    ii. If a record is found (Unicast packet), obtain from the record: unicast forwarding label 52 and next hop 53. The unicast forwarding label indicates the target {chiplet,port} in the ring. The next hop indicates the local tap port: first ring, second ring or local. The unicast forwarding label 52 is added to the packet (to provide a packet with a packet payload 41, packet header 42, unicast forwarding label 52, and next hop 53) hand the packet is sent over the next hop. In case of local switching the target port is embedded in the unicast forwarding label.
    iii. Unicast packets are assigned to the high priority queue. This queue is served is strict priority over the low priority queue.
    iv. Otherwise (the header is not in the forwarding database—this is a Broadcast packet), mark the packet with a broadcast forwarding label 54 and a source label 55. The broadcast forwarding label 54 represents a source (chiplet) based distribution tree build over the double ring. The source label 55 indicates the source port/trunk of the packet. The packet might be replicated to up to 3 interfaces: local and 2 rings. The local copy is further replicated to local ports—a procedure further described in the "Packets received on a ring port" bullet
    v. Broadcast packets are assigned to the low priority queue and are forwarded on a best effort basis.
    vi. Broadcast packets allow some level of communication at the service/application level using the excess bandwidth not used by datacenter control traffic
  b. Packets received on a ring port (such as 25(1,1) and 25(2,1) of FIG. 5)
    i. All packets received from the ring have either Unicast or Broadcast labels. The # of Unicast labels equals the number of ports in the switch and the number of Broadcast labels is equal to the number of chiplets (as required by the source based broadcast paradigm).
    ii. A Unicast packet access the unicast forwarding table and obtains its next tap ports (1bit: continue in the ring or terminate to the local port). If the packet is terminated then its label is stripped and the packet is forwarded to the relevant Ethernet port as indicated by the label.
    iii. A Broadcast packet access the broadcast forwarding table and obtain a list of tap ports for distribution (2b: continue in the ring and Local)—the output ports of the.
    iv. The Local copy is replicated to the local Ethernet ports as follows:
      1. Read the broadcast fan-out table. This vector indicates the ports (of chiplets) candidates for replication.
      2. Index the port membership table using the source label and obtain source membership vector. This vector indicates the local ports being members in that source. The size of the port membership table equals # of ports in the switch x # of ports in the chiplet.
      3. The distribution list is obtained by intersecting the fan-out vector with the source membership vector. This is a source filtering operation, needed for: (A) Filter the source port/trunk from the broadcast distribution list, (B) Perform the split horizon filter. That is, packets received on a spine switch facing port are not forwarded back to the spine. But packets received on a server facing port are forwarded to other servers.
      4. The packet is then replicated to the local Ethernet ports in the distribution list. In order to prevent broadcast storms to the management port(s), every management port should be removed from the Broadcast fan-out vector. This means that: (A) Traffic sent to the management processor must be preconfigured in the forwarding database, and (B) Traffic mirroring to CPU is not supported by the data-plane. Mirroring can be implemented by forwarding to the CPU and let the CPU reinject the packet to its destination c. Packets received on a management port. A management port supports two modes of operation: (A) Packets must be labeled by the management processor. This mode bypasses the forwarding decision (and forwarding label assignment) of the tap. (B) Packets are native Ethernet and their forwarding depends on the content of chiplet forwarding table. Referring to option (A)—Since the management processor provides the forwarding label (unlike the case of packet received on network port), there is no need for header parsing—management packets are forwarded by the tap just like packets in the ring. Mode (A) and (B) may be mutually exclusive and a configuration flag may define the mode. Alternatively—the modes can co-exist and an existence of the forwarding label may be indicated by a unique TPID or EtherType value.

To prevent the parking lot problem the tap includes an arbiter for choosing the next packet to be transmitted on the ring: the one received from the ring or the one received from the network.

The tap may hold very shallow buffering: ~3 packets per queue. Full queue result in tail-drop.

Every packet received on Ethernet ports may be subjected to IP<TTL> field examination and discard if equals 0.

Figure 7:
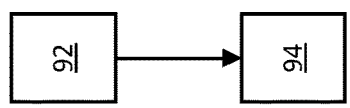
FIG. 7 is an example of a method.

Every packet transmitted on an Ethernet port is subject to the following header editing operations:
  a. MAC-SA overwrite to My MACaddr—one configuration per chiplet.
  b. MAC-DA overwrite to NextHopMac—a configuration per Ethernet port
  c. Decrement of IP<TTL> and IPv4<Checksum> update FIG. 7 illustrates method 90.

Method 90 may start by step 92 of receiving an indication that the main die failed or determining that the main die failed. The failure of the main die is such that triggers an initiation of a synchronous graceful failure. The main die and multiple chiplets belong to a high capacity switch data-plane device. The determining that the main die failed may be executed by a switch management processor of the high capacity switch data-plane device or by another entity within the high capacity switch data-plane device or outside the high capacity switch data-plane device.

Step 94 may be followed by step 94 of applying a secondary packet forwarding process by multiple chiplets, following the failure of the main die and during at least a part of the execution of the synchronous graceful process. The applying of the secondary packet forwarding process is less complex than a primary forwarding process applied by the main die while the main die is functional.

The multiple chiplets may be interconnected to each other by a secondary interconnect. The multiple chiplets may be coupled to the main die by a primary interconnect. The second interconnect may couple the multiple chiplets to form a bidirectional ring of chiplets.

Step 94 may include at least one out of:
  a. Utilizing, by each chiplet, a secondary chiplet forwarding database that has a size that is a fraction of a primary forwarding database utilized by the main die when performing the primary forwarding process.
  b. Unicasting packets that are labeled as unicast packets in one or more secondary chiplet forwarding database of one or more chiplets; and selectively broadcasting other packets.
  c. Applying source filtering.
  d. Applying split horizon filtering.
  e. Assigning a lower priority to selectively broadcast packets and assigning a higher priority to unicast packets.
  f. Allocating a first bandwidth to packets that are exchanged with the network.
  g. Allocating a second bandwidth to packets that are conveyed between the multiple chiplets.
  h. Preventing, during the selective broadcasting, from broadcast packets to reach the management processor.
  i. Preventing, during the selective broadcasting, from broadcast packets to reach predefined ports of the chiplets.

Figure 8:
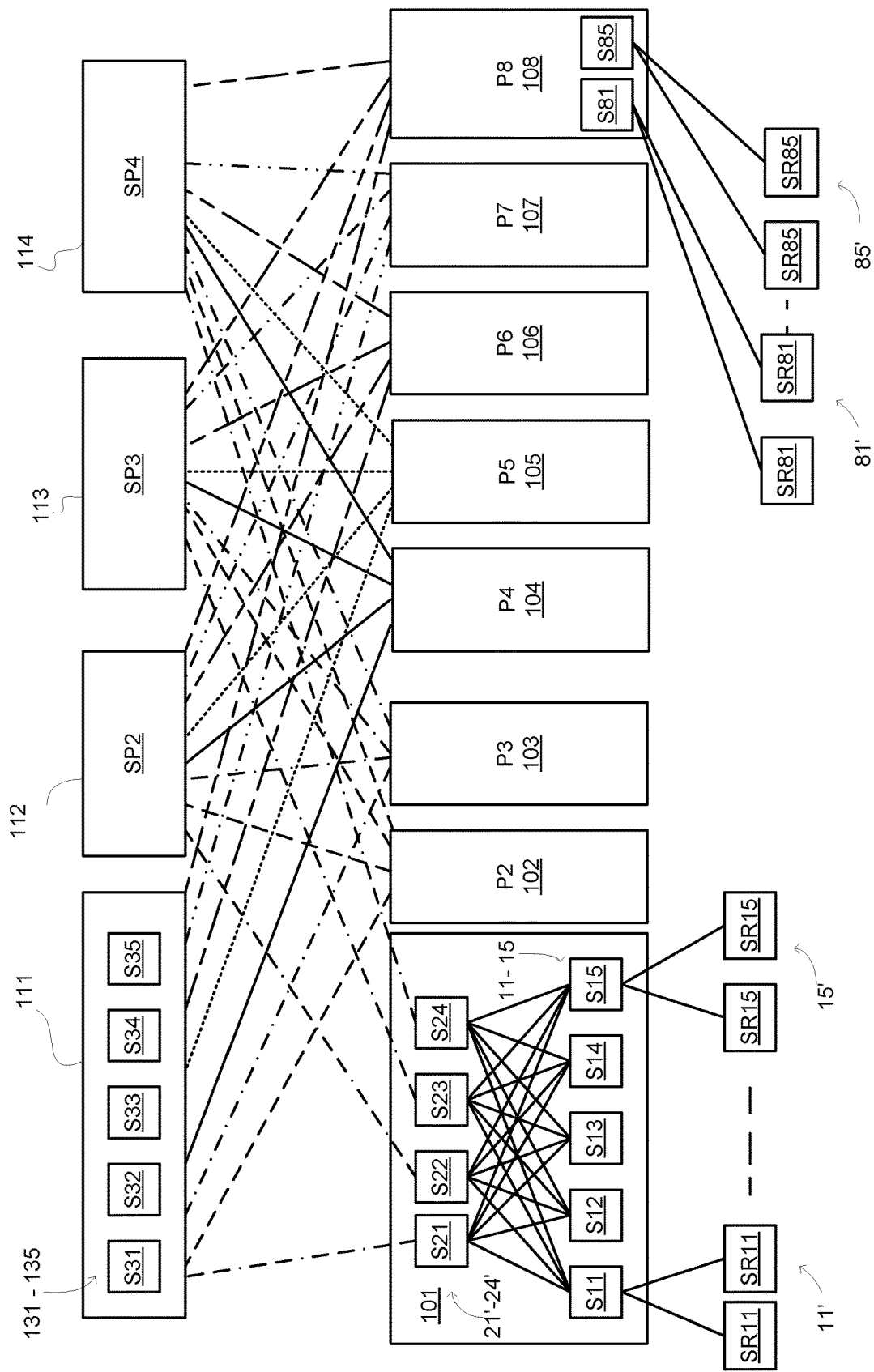
FIG. 8 is an example of a system.

FIG. 8 illustrates a system and multiple servers. The high capacity switch data-plane device 20 may be included in any of the first tire switches of the system 10—for example in any one of S11 11, S12 12, S13 13, S14 14, S15 15, S81-S85 81-85, and the like.

System 10 may be a data center, may be a part of a datacenter, and the like.

Multiple groups of servers are coupled to multiple first tier (T1) switches that are arranged in multiple pods (P1 101-P8 108). Each pod includes T1 switches and second tier (T2) switches. The T2 switches are coupled to third tier (T3) switches.

For example—first pod 101 is illustrated as including T1 switches S11-S15 11-15 that are coupled to T2 switches S21-S24 21'-24'.

FIG. 8 illustrates various groups of servers such as group of servers SR11 11' that are coupled to T1 switch S11, group of servers SR15 15' that are coupled to T1 switch S15, group of servers SR81 81' that are coupled to a T1 switch S81 of pod 2, and a group of servers SR85 85' that are coupled to a T1 switch S85 of pod 8.

A high capacity switch data-plane device 20 may serve a group of servers and the graceful failure may include closing the links (or stopping traffic) to a group of servers.

Source filter blocking may prevent outputting (during a selective broadcasting) a packet to the source port/trunk of the packet.

Split horizon filtering.—packets received on spine switch facing ports (ports that receive traffic from second tier switches) from are not forwarded to other Spine switches (other second tier switches) and are forwarded to all server facing ports (ports facing servers). Packets received on server facing ports are forwarded to all spine switches (ports that face second tire switches) and all server facing ports The protocol may be implemented on downstream direction (towards the servers) and/or on upstream direction (from the servers).

A system that applied the split horizon filtering may apply a minimum hop approach.

For example—a packet starting at a source server goes in the upstream direction only the minimum number of levels required to reach its destination within the system. Then it takes a single downstream path to the destination server. Packets do not perform unnecessary "zig-zags" that include, for example three or more changes of direction—such as upstream-downstream-upstream movement.

For example:

a. The system may allow traffic between servers coupled to a same T1 switch to flow without reaching any T2 switch. This traffic may be referred to as intra-leaf traffic.

b. The system may allow traffic between servers coupled to different T1 switches of a same pod without reaching any T3 switches. This traffic may be referred to as inter-leaf traffic.

c. The system may pass traffic between servers coupled to different pods at an upstream direction through T1, T2 and T3 switches—and then at a downstream direction through T3, T2 and T1 switches. This traffic may be referred to as intra-pod traffic.

It should also be noted that traffic between different tiers of the system may be routed along paths that may be determined based on various parameters such as the connection (for example, port, switch and pod) between each one of the source server and the destination server and/or may also be responsive to load balancing considerations (for example—load balancing between T3 switches).

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

The phrase "may be X" indicates that condition X may be fulfilled. This phrase also suggests that condition X may not be fulfilled. For example—any reference to a device as including a certain component should also cover the scenario in which the device does not include the certain component. For example—any reference to a method as including a certain step should also cover the scenario in which the method does not include the certain component. Yet for another example—any reference to a device that is configured to perform a certain operation should also cover the scenario in which the device is not configured to perform the certain operation.

The terms "including", "comprising", "having", "consisting" and "consisting essentially of" are used in an interchangeable manner. For example—any method may include at least the steps included in the figures and/or in the specification, only the steps included in the figures and/or the specification. The same applies to the device and the mobile computer.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one as or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements the mere fact that certain measures are recited in mutually different claims does not indicate that a combination of these measures cannot be used to advantage.

Any system, apparatus or device referred to this patent application includes at least one hardware component.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

Any combination of any component of any component and/or unit that is illustrated in any of the figures and/or specification and/or the claims may be provided.

Any combination of steps, operations and/or methods illustrated in any of the figures and/or specification and/or the claims may be provided.

We claim:

1. A method for responding to a failure of a main die of a switch data-plane device, the method comprises:
   detecting, by a switch management processor that is coupled to multiple chiplets, a failure of the main die that causes the main die to malfunction;
   applying a secondary packet forwarding process by the multiple chiplets, following the failure of the main die; wherein the multiple chiplets are interconnected to each other by a secondary interconnect; wherein the applying of the secondary packet forwarding process comprises transmitting packets over the secondary interconnect according to one or more forwarding rules of the secondary packet forwarding process; wherein the multiple chiplets are coupled to the main die by a primary interconnect; wherein the applying of the secondary packet forwarding process is less complex than a primary forwarding process applied by the main die while the main die is functional.

2. The method according to claim 1 wherein the applying of the secondary packet forwarding process comprises utilizing, by each chiplet, a secondary chiplet forwarding database that has a size that is a fraction of a primary forwarding database utilized by the main die when performing the primary forwarding process.

3. The method according to claim 1, wherein the applying of the secondary packet forwarding process comprise: unicasting packets that are labeled as unicast packets in one or more secondary chiplet forwarding database of one or more chiplets; and selectively broadcasting other packets.

4. The method according to claim 3, wherein the selectively broadcasting of the other packets comprises applying source filtering.

5. The method according to claim 3, wherein the selectively broadcasting of the other packets comprises applying split horizon filtering.

6. The method according to claim 3 wherein the second interconnect couples the multiple chiplets to form a bidirectional ring of chiplets.

7. The method according to claim 3, comprising assigning a lower priority to selectively broadcast packets and assigning a higher priority to unicast packets.

8. The method according to claim 3 comprising allocating a first bandwidth to packets that are exchanged with the network and allocating a second bandwidth to packets that are conveyed between the multiple chiplets.

9. The method according to claim 3 wherein the selectively broadcasting comprises preventing from broadcast packets to reach the switch management processor.

10. The method according to claim 3 wherein the selectively broadcasting comprises preventing from broadcast packets to reach predefined ports of the chiplets.

11. The method according to claim 1 wherein the failure of the main die is a complete shutdown of the main die.

12. The method according to claim 1 wherein the failure of the main die limits a capability of the main die to successfully apply the primary packet forwarding process for forwarding packets.

13. The method according to claim 1 wherein the applying of the secondary packet forwarding process comprise: unicasting, by a chiplet, a packet that has a packet header registered in a secondary chiplet forwarding database of the chiplet; and selectively broadcasting a packet that has a packet header not registered on the secondary chiplet forwarding database.

14. The method according to claim 1 wherein the primary packet forwarding process supports more communication protocols than the secondary forwarding process.

15. The method according to claim 1 wherein the primary packet forwarding process supports more packet header editing operations than the secondary forwarding process.

16. The method according to claim 1 wherein the primary packet forwarding process supports packet header integrity checks and the secondary forwarding process does not support packet header integrity checks.

17. The method according to claim 1 wherein the applying of the secondary packet forwarding process comprises (a) adding a forwarding label to a unicast packet that is sent from a source chipset to a target chipset, (b) and removing the forwarding label by the target chipset before sending the unicast packet outside the switch data plane device.

18. A non-transitory computer readable medium that stores instructions for:
   detecting, by a switch management processor that is coupled to multiple chiplets, a failure of the main die that causes the main die to malfunction;
   applying a secondary packet forwarding process by the multiple chiplets; wherein the main die belongs to a switch data-plane device; wherein the multiple chiplets are interconnected to each other by a secondary interconnect; wherein the applying of the secondary packet forwarding process comprises transmitting packets over the secondary interconnect according to one or more forwarding rules of the secondary packet forwarding process; wherein the multiple chiplets are coupled to the main die by a primary interconnect; wherein the applying of the secondary packet forwarding process is less complex than a primary forwarding process applied by the main die while the main die is functional.

19. The non-transitory computer readable medium according to claim 18 wherein the applying of the secondary packet forwarding process comprises utilizing, by each chiplet, a secondary chiplet forwarding database that has a size that is a fraction of a primary forwarding database utilized by the main die when performing the primary forwarding process.

20. The non-transitory computer readable medium according to claim 18, wherein the applying of the secondary packet forwarding process comprise: unicasting packets that are labeled as unicast packets in one or more secondary chiplet forwarding database of one or more chiplets; and selectively broadcasting other packets.

21. The non-transitory computer readable medium according to claim 20, wherein the selectively broadcasting of the other packets comprises applying source filtering.

22. The non-transitory computer readable medium according to claim 20, wherein the selectively broadcasting of the other packets comprises applying split horizon filtering.

23. The non-transitory computer readable medium according to claim 20 wherein the second interconnect couples the multiple chiplets to form a bidirectional ring of chiplets.

24. The non-transitory computer readable medium according to claim 20, that stores instructions for assigning a lower priority to selectively broadcast packets and assigning a higher priority to unicast packets.

25. The non-transitory computer readable medium according to claim 20 that stores instructions for allocating a first bandwidth to packets that are exchanged with the network and allocating a second bandwidth to packets that are conveyed between the multiple chiplets.

26. The non-transitory computer readable medium according to claim 20 wherein the selectively broadcasting comprises preventing from broadcast packets to reach the switch management processor.

27. The non-transitory computer readable medium according to claim 20 wherein the selectively broadcasting comprises preventing from broadcast packets to reach predefined ports of the chiplets.

28. A switch data-plane device comprising:
   a main die;
   a primary interconnect;
   multiple chiplets; and
   a secondary interconnect;
   a switch management processor that is coupled to multiple chiplets and is configured to detect a failure of the main die that causes the main die to malfunction;
   wherein the multiple chiplets are interconnected to each other by the secondary interconnect;
   wherein the multiple chiplets and are coupled to the main die by the primary interconnect;
   wherein the main die is configured to apply a primary forwarding process while the main die is functional; and
   wherein the multiple chiplets are configured to apply a secondary packet forwarding process by multiple chiplets, following the failure of the main die; wherein the applying of the secondary packet forwarding process comprises transmitting packets over the secondary interconnect according to one or more forwarding rules of the secondary packet forwarding process; wherein the applying of the secondary packet forwarding process is less complex than the applying of the primary packet forwarding process by the main die.

29. The switch data-plane device according to claim 28 wherein a chipset of the multiple chipsets comprises a first input interconnect, a second input interconnect, a first ring forwarding database, a second ring forwarding database, a first queuing and arbitrating unit, a second queuing and arbitrating unit, and a third queuing and arbitrating unit.

* * * * *